United States Patent
Droopad

(10) Patent No.: US 7,105,886 B2
(45) Date of Patent: Sep. 12, 2006

(54) HIGH K DIELECTRIC FILM

(75) Inventor: Ravindranath Droopad, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/895,552

(22) Filed: Jul. 21, 2004

(65) Prior Publication Data

US 2005/0101159 A1    May 12, 2005

Related U.S. Application Data

(60) Provisional application No. 60/519,765, filed on Nov. 12, 2003.

(51) Int. Cl.
 *A01L 29/76* (2006.01)
(52) U.S. Cl. .................. 257/310; 257/306; 257/382
(58) Field of Classification Search ............. 257/306, 257/295, 310
See application file for complete search history.

(56) References Cited

U.S. PATENT DOCUMENTS 6,531,354 B1   3/2003 Maria et al.
6,541,280 B1   4/2003 Kaushik et al.
2004/0211998 A1*  10/2004 Araujo et al. ............. 257/295

OTHER PUBLICATIONS

Ovanesyan, K.L. et al., "Czochralski single crystal growth of Ce- and Pr-doped LaLuO$_3$ double oxide," Journal of Crystal Growth 198/199 (1999), pp. 497-500, Elsevier Science B.V.
Ovanesyan, K.L. et al., "Single crystal growth and characterization of LaLuO$_3$," OPTICAL Materials, Sep. 1998, pp. 291-295, Elsevier Science B.V.

\* cited by examiner

*Primary Examiner*—Edward Wojciechowicz
(74) *Attorney, Agent, or Firm*—Kim-Marie Vo

(57) ABSTRACT

A dielectric layer comprised of lanthanum, lutetium, and oxygen that is formed between two conductors or a conductor and a substrate. In one embodiment, the dielectric layer is formed over the substrate without the need for an additional interfacial layer. In another embodiment, the dielectric layer is graded with respect to the lanthanum or lutetium content or in the alternative, may include aluminum. In yet another embodiment, an insulating layer is formed between the conductor or substrate and the dielectric layer or between both the conductor and substrate and the dielectric layer. The dielectric layer is preferably formed by molecular beam epitaxy, but can also be formed by atomic layer chemical vapor deposition, physical vapor deposition, organometallic chemical vapor deposition or pulsed laser deposition.

12 Claims, 4 Drawing Sheets

HIGH K DIELECTRIC FILM

FIELD OF THE INVENTION

This invention relates to devices used in and methods for making integrated circuits, and more particularly to high K dielectrics used in making integrated circuits. This application claims benefit of U.S. Ser. No. 60/519,765 filed Nov. 12, 2003.

BACKGROUND OF THE INVENTION

CMOS devices contain both n- and p- channel field effect transistors (FET) and form the basis of integrated circuits. These transistors are metal oxide-based semiconductor devices which include a source and drain region and an insulated gate in between. As the density of integrated circuits and performance increases, the dimensions of the transistors have to be reduced. As a result the thickness of the insulated gate dielectric layer has to be made smaller. With regard to gate dielectrics, one of the desirable features of the dielectric layer is that it couple the overlying gate electrode to the underlying channel so that the channel is responsive to the stimulus applied to the gate. In this regard it is desirable for that dielectric to have a high dielectric constant commonly known as high K. Silicon dioxide has been by far, the most common and effective gate insulator used in making integrated circuits. This has a very high level of integrity and, in particular, is able to be made with a very low defect density. The result is that the silicon dioxide operates very effectively causing devices to have low current leakage. Unfortunately, the leakage current increases dramatically with reduced thickness of the gate dielectric. For example, $SiO_2$ having a thickness of less than 20Å results in unacceptable leakage current and degraded device performance. Accordingly there exists a need to replace the $SiO_2$ in CMOS devices. Leakage currents can be reduced by having a thicker high K layer having reduced equivalent ($SiO_2$) oxide thickness.

One of the characteristics that is desirable for the high K dielectric is that it be amorphous. It must remain amorphous for its entire life including during manufacturing and subsequently during functional operation as part of the completed integrated circuit. Many of the alternative high K dielectrics have sufficiently high K and sufficient integrity at time of deposition, but over subsequent processing steps and the heating that is associated with that, the result is crystallizing of these films. These films that are so crystallized are not perfectly crystallized throughout their entire length and width but have areas known as grain boundaries between the crystalline structures that are formed. These grain boundaries are areas of leakage and other problems that affect electrical performance.

Currently there is much work being done in developing high K dielectrics that have a higher dielectric constant than that of silicon oxide. There are a number of those, but one of the advantages of silicon oxide is its high band gap and low interface state density with silicon which results in it being a very effective insulator. Thus, many of the materials being developed for high K purposes have been found to have problems because they do not have a high enough band gap or because they are difficult to make with enough integrity to prevent current leakage through the dielectric. Additional problems remain unresolved such as thermal stability with the silicon substrate and gate electrode, fermi level pinning at the oxide/metal interface and scaling. Even though amorphous materials including Hr-based and Zr-based oxides are being investigated, there appears to be no clear solution since there are outstanding problems with these materials when integrating into a CMOS flow. Also, these materials recrystallized during the high temperature steps during the manufacturing process. La-based oxide materials can potentially be used as a high K dielectric for Si CMOS devices. Such oxides have higher dielectric constant than $SiO_2$ and are predicted to be thermodynamically stable in contact with silicon.

An alternative to amorphous is monocrystalline films. In theory, high K dielectric films can be made typically monocrystalline, although difficulties exist. One such difficulty is matching the crystalline structure of the film with that of the underlying semiconductor, typically silicon, as well as during the formation process that it be in fact perfectly formed. Epitaxial layers, that is layers that are monocrystalline, are known in the industry. Silicon can be made epitaxially. One of the techniques by which very thin films can be put down in a monocrystalline form is molecular beam epitaxy. Even with using MBE technology there is still the difficulty of ensuring defect free films.

In developing new high K dielectrics there is also another potential problem of having too high of a dielectric constant. If the dielectric constant is too high, there is an effect that is called fringing field effect which adversely affects the performance of the transistor. This has to do with excessive coupling between the gate and the source/drain. Thus, the materials that are being developed desirably have a range typically between 20 and 40 for the dielectric constant. This range may change somewhat as the technology develops further.

Another aspect of a desirable high K dielectric is in terms of its equivalent capacitance to that of a certain thickness of silicon oxide. Silicon oxide has been so commonly and effectively used that it has become a standard and the industry often describes certain characteristics in terms of its relationship to silicon oxide. In this case, the typical desirable silicon oxide equivalent thickness is between 5 and 15 angstroms but with silicon oxide of 5 to 15 angstroms it has problems with leakage, reliability, growth rate, and uniformity. Thus, when a film is that small there can be difficulties in manufacturing it as well as using it. The desirable coupling is to have a dielectric that has the equivalence of the thickness of 5 to 15 angstroms of silicon oxide but a greater actual thickness.

High K dielectric films which include aluminum have been developed, yet aluminum is known to cause high interface state density and degraded mobility in silicon based devices.

Thus, there is a need for a dielectric film which has a dielectric constant within a desirable range, the ability to be made of high integrity, a thickness in a desirable range, does not degrade mobility or cause high interface state densities, and has the ability to be made in a manufacturing process.

SUMMARY OF THE INVENTION

To achieve the objects and advantages specified above and others, disclosed is a semiconductor structure and method of fabricating the semiconductor structure which includes providing a semiconductor substrate; providing a dielectric layer comprising lanthanum, lutetium, and oxygen over the semiconductor substrate; and providing an electrode layer over the dielectric layer.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENTS

The following detailed description is of exemplary embodiments only and is not intended to limit the invention or the application and uses of the invention. Rather, the following description provides a convenient illustration for implementing exemplary embodiments of the invention. Various changes to the described embodiments may be made in the function and arrangement of the elements described without departing from the scope of the invention as set forth in the appended claims. A high K dielectric film comprising lanthanum, lutetium, and oxygen provides an excellent candidate material for replacement of silicon dioxide. It combines the advantages of having a desirable range of dielectric constant, the ability to remain amorphous at high temperatures, and provides for low leakage.

Figure 1:
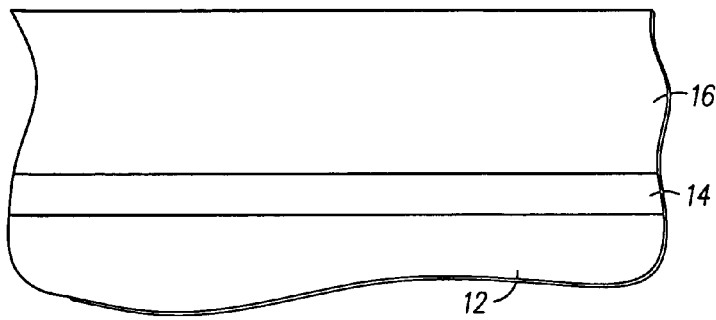
FIG. 1 is a cross section of a portion of an integrated circuit according to a first embodiment of the invention.

Shown in FIG. 1 is a portion 10 of an integrated circuit having a substrate 12 of semiconductor material, a dielectric film 14 and a conductive film 16. Substrate 12 has a semiconductor region at least at a surface thereof. The underlying portion, not shown, can either be also semiconductive material or it can be insulative material which is typical for SOI. Examples of semiconductive material include monocrystalline silicon, and gallium arsenide. Over and on substrate 12 is dielectric layer 14. Above and on dielectric layer 14 is conductive film 16 which functions as a gate electrode. Dielectric layer 14 operates as a gate insulator or gate dielectric. Substrate 12, as shown here at the area near the surface at the interface with dielectric film 14, is a channel of a transistor.

Gate dielectric 14 comprises lanthanum lutetium oxide which is a compound comprising lanthanum, lutetium, and oxygen. The formula is written as $LaLuO_3$ with the concentration of lanthanum and lutetium being the same. In the instance where aluminum is added to the dielectric compound (discussed presently), the formula is written as $La(Al)_xLu_{1-x}O_3$ where x>0. Lanthanum lutetium oxide is disclosed as having a dielectric constant of approximately 25 and a bandgap of more than 5 eV. As a result, successful deposition of lanthanum lutetium oxide on substrate 14, such as a silicon substrate, makes this material suitable for gate dielectric application.

Gate dielectric 14, as disclosed herein, is preferably formed using molecular beam epitaxy (MBE) in which the individual elements are evaporated from thermal sources. Alternatively, the elements can be generated using e-beam deposition, atomic layer chemical vapor deposition (AL-CVD), physical vapor deposition, organometallic chemical vapor deposition, and pulsed laser deposition. The preferred approach is MBE which allows for precise control of the formation of the layer including thickness, which in this case is not less than about 15 angstroms and preferably in the range of 20 to 100 angstroms. Gate conductor 16 in current integrated circuit technology is typically polysilicon but can be other conductors such as a metal including, but not limited to, tungsten, Ti-nitride, tantalum nitride, or any conductor useful as a gate conductor.

The gate dielectric 14 being deposited by MBE is also useful in ensuring that the film is deposited in an amorphous condition. Using current MBE technology, the surface of substrate 12 is either initially cleaned so that it is free of the native silicon oxide layer, or a thin layer of silicon oxide or silicon oxynitride may be present (discussed presently). It is anticipated by this disclosure that the surface of substrate 12 is cleaned and thermally heated to remove contaminants, prior to the deposition of the lanthanum lutetium oxide, thereby providing for less process steps by maintaining the silicon substrate and silicon oxide interface. As stated, alternatively the native oxide may be thermally removed prior to deposition of the lanthanum lutetium oxide by heating in UHV conditions or alternatively by using a Si-assisted desorption process or a Sr-assisted desorption process. In this instance, a clean surface (subsequent to removal of low K material) increases the capacitance of the dielectric stack and results in an increased ability to scale the device to lesser dimensions, In another alternative embodiment, it is anticipated that the native oxide may be removed and the surface treated by oxygen and nitrogen to form a silicon oxynitride on the surface of substrate 12, prior to deposition of the lanthanum lutetium oxide. This formation of a silicon oxynitride on the surface provides for an interface between the substrate and gate dielectric 14 having a higher dielectric constant than an interface with $SiO_2$.

During the MBE process to deposit the lanthanum lutetium oxide, molecular oxygen is controllably introduced into a reaction chamber using an orifice or a plasma source where it is possible to use activated oxygen atomic species. The introduction of lanthanum and lutetium with the oxygen thus forms a single layer of lanthanum lutetium oxide as dielectric layer 14, overlying substrate 12.

This lanthanum lutetium oxide provides benefit in the area of optimizing the dielectric coefficient for low leakage and increased capacitance. Some other materials have identifiable deficiencies. For example, a binary compound of lanthanum oxide has a dielectric constant that is in the right range but it absorbs water. The absorption of water is very detrimental to desirable manufacturing of integrated circuits. For example, the absorption of water by lanthanum oxide results in structural integrity problems making it unusable in forming an integrated circuit structure. The introduction of lutetium provides for a very stable gate dielectric, that remains amorphous and does not recrystallize at high temperature and thus remains stable when in contact with substrate 12. In addition, the use of a lanthanum lutetium oxide provides for a high band gap, being greater than 5 eV, with reasonable band offset, a dielectric constant of approximately 25, and a coefficient of thermal expansion that is similar to silicon.

Another benefit of lanthanum lutetium oxide is that the dielectric constant can be varied based upon the extent of the lanthanum content and the lutetium content. Thus, an optimized dielectric constant is achieved somewhere between 10 and 25. Even somewhat greater coefficients can be obtained where the lanthanum content relative to the lutetium content is varied, but this may result in problems associated with water absorption. In addition, it is anticipated by this disclosure to include aluminum or nitrogen in dielectric layer 14, thereby increasing the stability of the dielectric layer and passivation of defects as well as possibly increasing the dielectric constant.

The lanthanum lutetium oxide advantageously remains amorphous even at temperatures up to 1,025 and perhaps even more. 1,025 degrees Celsius is a typical highest temperature for current manufacturing processes. Thus, lanthanum lutetium oxide has been found to withstand the highest temperature that will be received during processing of an integrated circuit that is made by many typical processes for the most advanced geometries and remain amorphous. The desire is for maximum processing temperatures to drop some, but maximum temperatures will likely remain fairly high because the activation of dopants in the source/drains requires a high temperature and such activation is expected to be a requirement for the foreseeable future. Maximum temperatures may drop somewhat below 1,025 but will still be expected to be over 900 degrees Celsius for at least quite some time. There is no certainty, however, that significant lowering of temperatures will occur and 1,025 may continue to be a valid requirement for quite some time. Thus, the amorphous lanthanum lutetium oxide provides the desirable high K characteristics and high integrity over anticipated temperature ranges.

Another benefit of being able to deposit the effective high K dielectric film of amorphous lanthanum lutetium oxide is that it can be very effective, not just on silicon, but also on gallium arsenide. One of the problems in effectively implementing gallium arsenide CMOS technology thus taking advantage of its higher mobility, is that the gate dielectrics used in gallium arsenide are very difficult to match the integrity of those of silicon, which are achieved by growing silicon oxide at high temperature. Thus, in most applications silicon has proven to be superior to gallium arsenide. Now with an effective high K dielectric deposited using MBE, the result is that the gate dielectric can be of high integrity whether deposited over silicon, gallium arsenide or some other semiconductor material. The result may be that gallium arsenide will become the preferred choice for most integrated circuits and not be just a niche in the semiconductor market that it is now.

Figure 2:
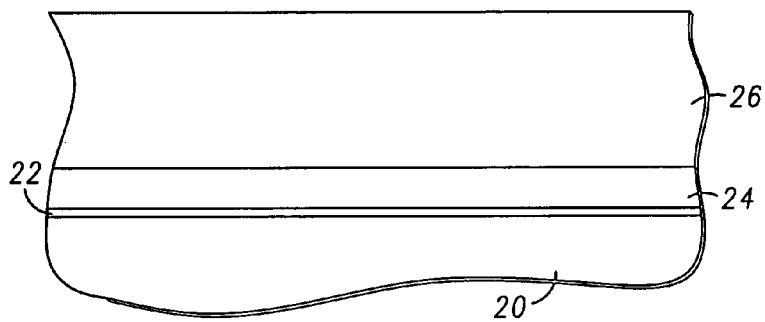
FIG. 2 is a cross section of a portion of an integrated circuit according to a second embodiment of the invention.

Shown in FIG. 2 is a portion 18 of an integrated circuit comprising a substrate 20, a barrier dielectric 22, a high K dielectric 24, and a conductor 26. In this case, high K dielectric 24 is similar or analogous to film 14 of FIG. 1 in that it is lanthanum lutetium oxide. Conductor 26 is analogous to conductor 16 and substrate 20 is analogous to substrate 12 in FIG. 1 having one of a clean surface, a remaining native oxide on the surface, or oxynitride present on the surface, as previously described. Barrier dielectric 22, which may also be referred to as an interfacial layer, is chosen for its desirable characteristics as an insulator. This may be, for example, lanthanum oxide, lutetium oxide, silicon oxide or silicon oxynitride. Barrier dielectric 22 is present to insure that the combination of high K dielectric 24 and barrier dielectric 22 have sufficient insulation characteristics to prevent unwanted current flow. For example, the combination would have a high bandgap and would have a sufficiently high dielectric constant. In particular, this places a high bandgap material in direct contact with the substrate 20 which is the potential source of electron injection. Another potential use for barrier dielectric 22 is as a diffusion barrier if the material chosen for substrate 20 has a problem or reaction with lanthanum lutetium oxide.

Figure 3:
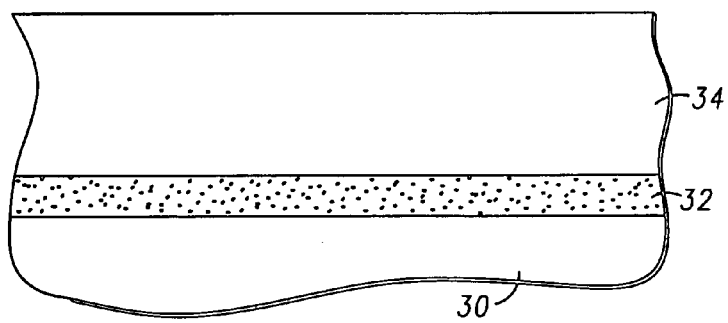
FIG. 3 is a cross section of a portion of an integrated circuit according to a third embodiment of the invention.

Shown in FIG. 3 is a portion 28 of an integrated circuit comprising a substrate 30, a dielectric film 32, and a conductor 34. In this case substrate 30 is analogous to substrates 20 and 12 and conductor 34 is analogous to conductors 26 and 16. Dielectric film 32 substitutes for dielectric 14 and for the combination of dielectrics 22 and 24. In this case dielectric film 32 has a graded concentration of lanthanum or lutetium, meaning a binary material, namely lanthanum oxide or lutetium oxide, is formed adjacent the interface of substrate 30 and dielectric film 32 and graded to a ternary material, namely lanthanum lutetium oxide, as the layer interfaces with conductor 24 through the addition of either lanthanum or lutetium. In the dielectric film 32, near the interface with substrate 30, the material is essentially purely lanthanum oxide or lutetium oxide. In moving towards conductor 34, in the instance where a lanthanum oxide is deposited near the interface of substrate 30, the concentration of lutetium continuously increases until there is a 1 to 1 ratio between lanthanum and lutetium in the dielectric film 32 near the interface with conductor 34. In the instance where a lutetium oxide is deposited near the interface of substrate 30, the concentration of lanthanum continuously increases until there is a 1 to 1 ratio between lanthanum and lutetium in the dielectric film 32 near the interface with conductor 34. The advantage of this approach is that it provides for the desirable high band gap immediately next to substrate 30 and avoids any abrupt interfaces between the lanthanum oxide or lutetium oxide and the lanthanum lutetium oxide. The resulting dielectric constant can be adjusted as well by controlling the rate at which the concentration is increased, that is the 1 to 1 ratio between lanthanum and lutetium can be achieved well before the interface with conductor 34. An alternative is for the grading to continue past the one to one ratio so that the concentration of lanthanum exceeds the concentration of lutetium, or vice versa.

Figure 4:
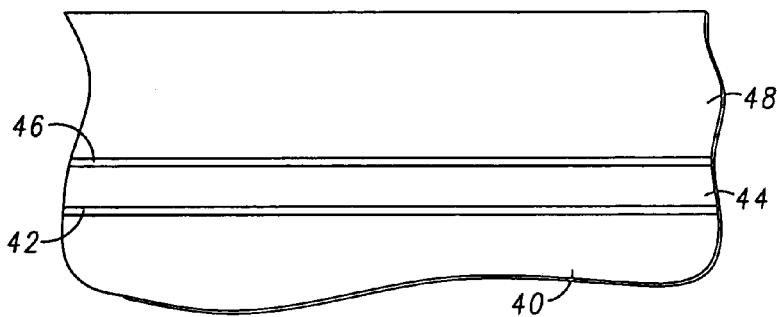
FIG. 4 is a cross section of a portion of an integrated circuit according to a fourth embodiment of the invention.

Shown in FIG. 4 is a portion 36 of an integrated circuit comprising a substrate 40, a barrier dielectric 42, a high K dielectric 44, a barrier dielectric 46 and a conductor 48. In this case, the substrate 40 is analogous to substrates 12, 20 and 30. Barrier dielectric 42 is analogous to barrier dielectric 22. High K dielectric 44 is analogous to high K dielectrics 14 and 24. Conductor 48 is analogous to conductors 16, 26 and 34. Barrier layer 46 provides a barrier between high K dielectric 44 and conductor 48. Barrier 46 is for the case in which conductor 48 has a compatibility problem with high K dielectric 44. Barrier 46 would be chosen most likely also among lanthanum oxide, lutetium oxide, silicon oxide, and silicon oxynitride. The purpose of barrier dielectric 46 would be to provide a diffusion barrier between conductor 48 and high K dielectric 44. Of course, it would be desirable for barrier layer 46 to have a high dielectric constant, but its purpose is to prevent problems between conductor 48 and high K dielectric 44. A preferred choice is likely to be either lanthanum oxide or lutetium oxide because they have higher dielectric constants than silicon oxide.

Figure 5:
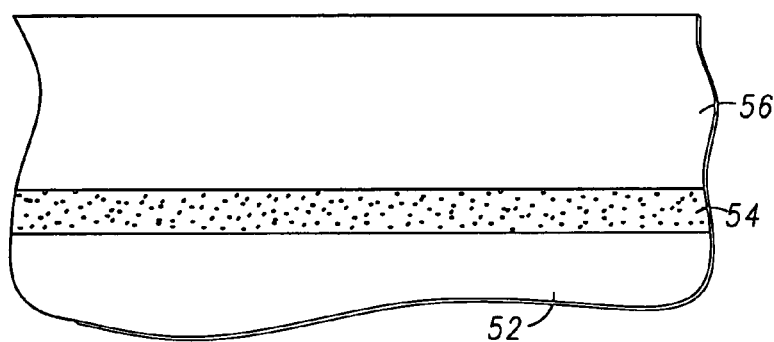
FIG. 5 is a cross section of a portion of an integrated circuit according to a fifth embodiment of the invention.

Shown in FIG. 5 is a portion 50 of an integrated circuit comprising a conductor 52, a high K dielectric 54 and a conductor 56. In this case, the applicability of the high K dielectric is between two conductors. This arises primarily in the case where conductor 52 is a floating gate for storing charge. It can also come up in situations where 52 and 56 comprise capacitor plates which are utilized for storing charge. One such example is the memory cell of a dynamic random access memory. In such a case it is also desirable for high K dielectric 54 to have a high dielectric constant as well as having the desirable characteristics of low leakage.

As illustrated in FIG. 5, high K dielectric 54 is lanthanum lutetium oxide having a graded concentration. The concentration of lanthanum is maximized in the middle whereas pure or nearly pure lutetium oxide is at the interface with conductor 52 and at the interface of conductor 56. This provides for the relatively high dielectric constant and for high band gap at both the interface with conductor 52 and the interface with conductor 56 so that it is both a high K dielectric and an excellent insulator. By having high K dielectric 54 graded, the sharp interfaces between insulator types is avoided. Sharp transitions between material types tend to be places where charge can be trapped. With a graded concentration the sharp interfaces are avoided. In the case of a transistor, it is most important to have the high band gap only next to the substrate because that is where the charge is potentially injected whereas in the case of portion 50 charge can be injected from either conductor 52 or conductor 56. Thus, it is desirable to have high band gap at the interface with both conductor 52 and conductor 56. It should be understood that a reverse material stack is anticipated by this disclosure, namely wherein the concentration of lanthanum is maximized in the middle and pure or nearly pure lutetium oxide is at the interface with conductor 56 and at the interface with conductor 52.

Figure 6:
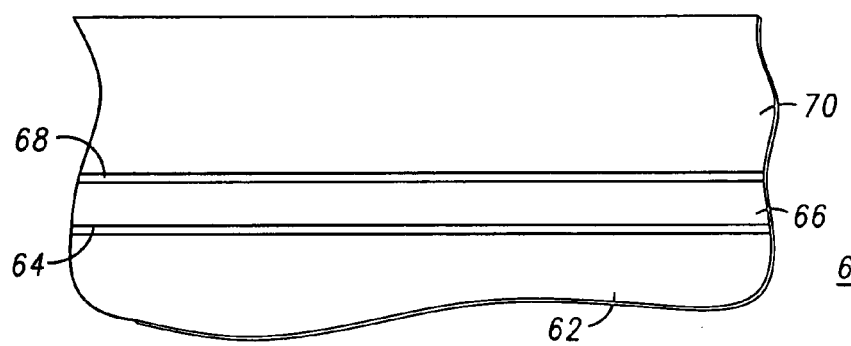
FIG. 6 is a cross section of a portion of an integrated circuit according to a sixth embodiment of the invention.

Shown in FIG. 6 is a portion 60 of an integrated circuit comprising a conductor 62, a barrier dielectric 64, a high K dielectric 66, a barrier dielectric 68 and a conductor 70. This is an analogous structure to FIG. 5. Conductor 62 is analogous to conductor 52 and conductor 70 is analogous to conductor 56 and the combination of layers 64, 66, and 68 is analogous to high K dielectric 54 in FIG. 5. In the case of FIG. 6, dielectric layers 64 and 68 operate both to provide high band gap and as a diffusion barrier between conductors 62 and 70 and high K dielectric 66. Thus, the addition of barrier layers 64 and 68 may be necessary both for sufficient insulation quality as well as providing diffusion barrier to high K dielectric 66. Conductors 62 and 70 may have different characteristics. One may be polysilicon. The other may be a metal in which case the type of barrier dielectric may be desirably different. High K dielectric 66 comprises lanthanum lutetium oxide having the benefits described for lanthanum lutetium oxide for film for the structures of FIGS. 1–5.

The likelihood that barriers will be required in the case of two conductors as distinct from the formation of a transistor is increased because it is, in fact, desirable for injection to occur between conductors 62 and 70 in some circumstances. Thus, the likelihood of needing barriers 64 and 68, or grading as in FIG. 5, so that such injection does not occur when it is undesirable for it to occur is more likely to be a situation that actually happens. Thus, the likelihood of needing barriers 64 and 68, or the grading shown in FIG. 5, is greater in the case where there is a storage of charge by injection. Also, in the case where it is purely acting as a capacitor, it is still more likely to need barrier layers 64 and 68. The primary purpose of a capacitor is storing charge so that the importance of having high band gap at the interface to the conductor may be more important than even for a transistor.

The following example illustrates a method, in accordance with one embodiment of the invention, for fabricating a semiconductor structure such as structure 10 depicted in FIG. 1. The method starts by providing a monocrystalline semiconductor substrate comprising a material selected from Group IV or Group III-V of the periodic table. In accordance with a preferred embodiment of the invention, the semiconductor substrate is a silicon wafer having a (100) orientation. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. The following process is preferably carried out by molecular beam epitaxy (MBE), although other deposition processes including physical vapor deposition, atomic layer deposition or metalorganic chemical vapor deposition may also be used in accordance with the present invention. The native oxide is removed by heating the substrate to temperatures greater than 800 degrees C in the MBE chamber. A clean silicon surface displays a (2×1) surface reconstruction as monitored by reflection high energy electron diffraction (RHEED). In another embodiment the native oxide is removed by depositing a thin layer (preferably 1–3 monolayers) of strontium, barium, a combination of strontium and barium, or other alkaline earth metals or combinations of alkaline earth metals in an MBE apparatus and heating it to temperatures in excess of 750 degrees C.

Following the appearance of a sharp (2×1) surface reconstruction, the temperature of the substrate is lowered to between room temperature and 500 degrees C., preferably 50 to 400 degrees C. Oxygen in then introduced into the MBE chamber directed towards the cleaned substrate. Concurrently, the shutters on the effusion sources are opened to allow atoms of lanthanum and lutetium to impinge upon the semiconductor substrate forming layer 14 of lanthanum lutetium oxide. In another embodiment aluminum can be introduced to form a layer of lanthanum aluminum lutetium oxide. Following deposition of layer 14 to the desired thickness, a gate electrode is deposited by physical vapor deposition or by any other deposition techniques as is known in the art.

Figure 7:
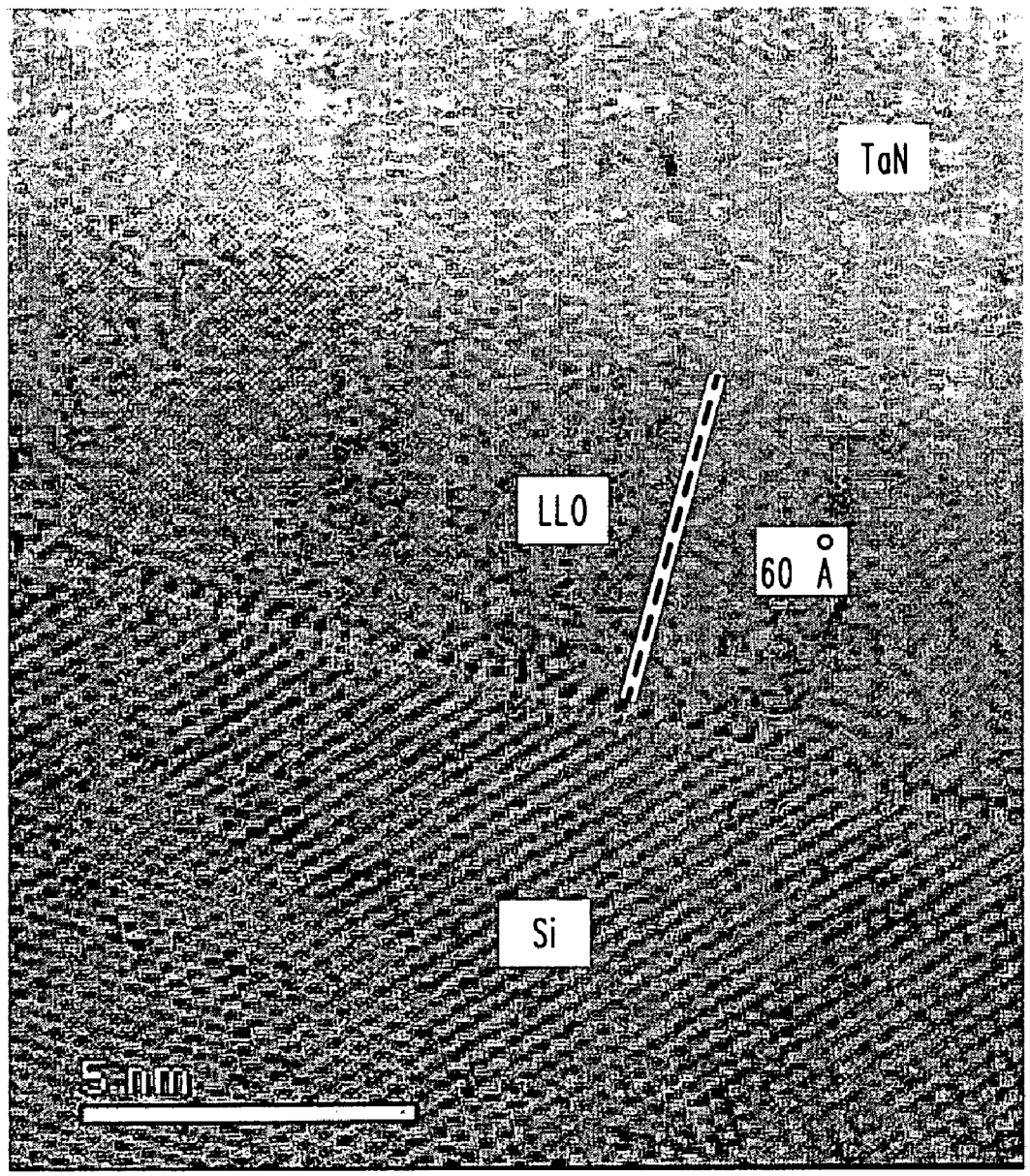
FIG. 7 is a transmission electron micrograph of a 50 Å $LaLuO_3$ layer deposited on silicon according to the present invention after annealing at 700 degrees C.

Shown in FIG. 7 is a transmission electron micrograph 80 of a 50 Å thick $LaLuO_3$ layer deposited on Si at 200 degrees C. As depicted, subsequent to fabrication of the dielectric layer, a layer of TaN is deposited and annealed at 700 degrees C. The interface between the dielectric layer and the substrate appears to be extremely flat with a thin interfacial layer present. Heating this layer to a temperature of 900 degrees C. does not cause any re-crystallization.

Figure 8:
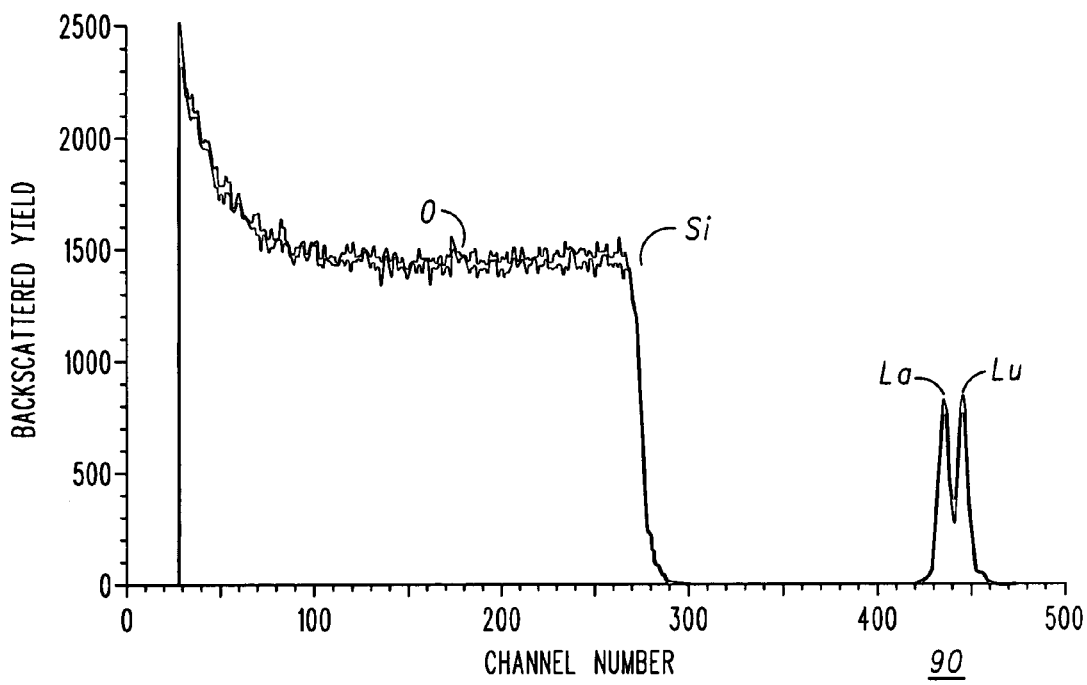
FIG. 8 shows a Rutherford Backscattering Spectra of a 50A as deposited $LaLuO_3$ layer deposited at 200 degree C. on silicon according to the present invention.
Figure 9:
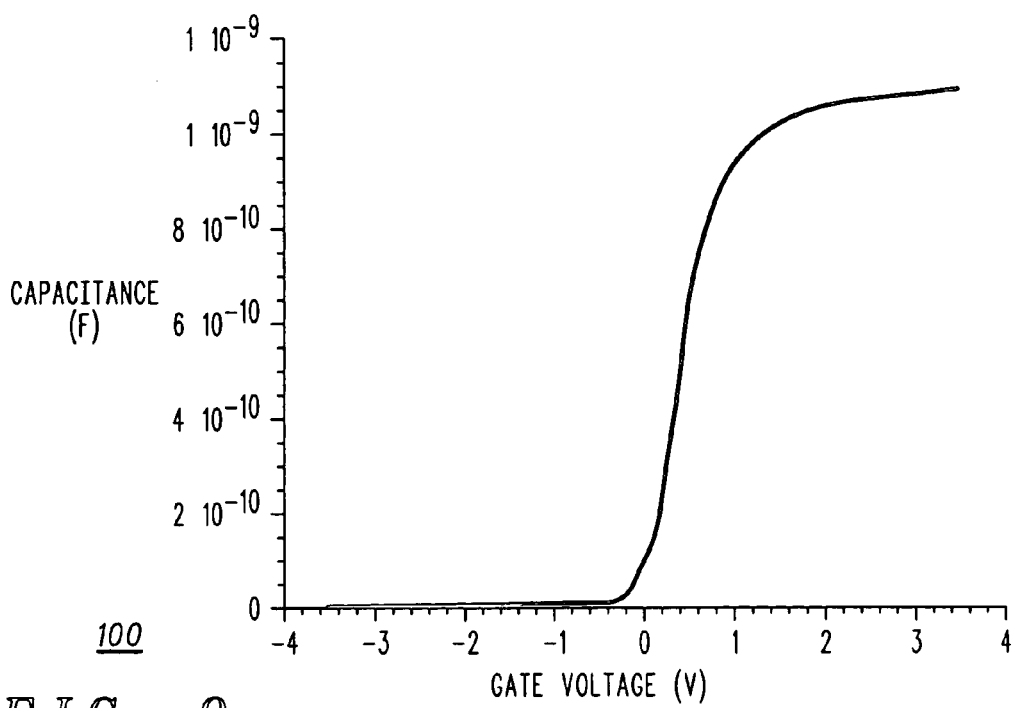
FIG. 9 illustrates graphically the C–V curves for a 50 Å $LaLuO_3$ layer deposited on silicon at 200 degree C.

FIG. 8 shows a RBS spectra 90 of a $LaLuO_3$ dielectric layer deposited on silicon showing the presence of La and Lu. An analysis of the spectra revealed that the La to Lu ratio is close to 1:1. The electrical properties of the oxide layer are determined by fabricating capacitors and measuring the capacitance with respect to the applied voltage. FIG. 9 shows a capacitance-voltage curve 100 for a capacitor fabricated using the $LaLuO_3$ dielectric layer on silicon, showing well behaved characteristics.

In accordance with another embodiment of the invention, the silicon substrate can be covered with a thermally grown silicon dioxide layer (not shown) in structure 10 of FIG. 1. Alternatively the surface of the silicon can be covered with a layer of silicon oxynitride. The silicon dioxide can be prepared using chemical means that leaves an oxide no greater than 10 angstrom. Alternatively the silicon substrate can be cleaned in-situ as described above to leave a clean well reconstructed surface. This surface is then exposed to a flux of oxygen, in the form of molecular oxygen, activated oxygen as generated in a plasma source or ozone. The exposure conditions can be controlled so that a desired thickness in the range of 1 to 15 angstrom, preferably 3–8 angstrom, of the silicon dioxide can be achieved. In another embodiment the clean silicon surface can be exposed to a flux of oxygen and nitrogen to form an silicon oxynitride layer. The nitrogen can be supplied in a gaseous form including nitrous oxide or activated nitrogen as generated in a plasma source. Following the preparation of the interface layer of silicon dioxide or silicon oxynitride, the deposition of the high-k dielectric layer can be deposited.

In accordance with another embodiment of the invention, the high K dielectric can be of a form $La(Al)_xLu_{1-x}O_3N_y$, where y>0. This is accomplished by depositing the high K dielectric layer in the presence of nitrogen as describe above. Nitrogen incorporation into the high K dielectric film can potentially increase the thermal stability and reduce trap densities.

While the invention has been described in various embodiments, there may be other embodiments and other materials that may be used in combination that will provide the benefit or some of the benefits that are associated with this invention. Other materials than those mentioned may be used. In addition, there may be materials that can be added to lanthanum lutetium oxide that may provide benefits as well in addition to those provided by the lanthanum lutetium oxide in the combinations and the various concentrations that are described. Accordingly, it is the claims that define the scope of this invention.

What is claimed is:

1. A semiconductor structure comprising:
   a semiconductor substrate;
   a dielectric layer comprising lanthanum, lutetium, and oxygen overlying the semiconductor substrate, wherein the dielectric layer further comprises aluminum and has a formula of $La(Al)_xLu_{1-x}O_3$, where x>0; and
   an electrode layer overlying the dielectric layer.

2. A semiconductor structure comprising:
   a semiconductor substrate;
   a dielectric layer comprising lanthanum, lutetium, and oxygen overlying the semiconductor substrate, wherein one element of the dielectric layer is graded from zero to an amount greater than zero; and
   an electrode layer overlying the dielectric layer.

3. The semiconductor structure of claim 2 wherein the dielectric film is stoichiometric.

4. A semiconductor structure comprising:
   a semiconductor substrate;
   a first conductive layer over the semiconductor substrate;
   a dielectric layer comprising lanthanum, lutetium, and oxygen over the first conductive layer, wherein the dielectric layer further comprises aluminum and has a formula of $La(Al)_xLu_{1-x}O_3$, where x>0;
   a second conductive layer over the dielectric layer;
   a first interfacial layer between the first conductive layer and the dielectric layer; and
   a second interfacial layer between the dielectric layer and the second conductive layer;
   wherein the first interfacial layer comprises oxygen and one of lanthanum or lutetium.

5. The semiconductor structure of claim 4 wherein the second conductive layer is a floating gate.

6. The semiconductor structure of claim 4 wherein the dielectric layer further comprises aluminum and has a formula of $La(Al)_xLu_{1-x}O_3$, where x>0.

7. The semiconductor structure of claim 4 wherein the dielectric layer is amorphous.

8. The semiconductor structure of claim 4 wherein the second interfacial layer comprises an element selected from the group consisting of silicon, nitrogen, oxygen, lanthanum, and lutetium.

9. The semiconductor structure of claim 4 wherein the first interfacial layer and second interfacial layer are the same material.

10. A semiconductor device, comprising:
    a first material selected from a substrate having a semiconductor surface and a conducting layer;
    a second material, said second material being a layer which is conductive;
    a third material disposed between the first and second material and comprising lanthanum, lutetium, and oxygen, wherein said third material is amorphous and wherein the third material further includes aluminum and has a formula of $La(Al)_xLu_{1-x}O_3$, where x>0.

11. The semiconductor device of claim 10 wherein the third material further includes aluminum and has a formula of $La(Al)_xLu_{1-x}O_3$, where x>0.

12. The semiconductor device as claimed in claim 10 further including a fourth material disposed between the third material and the first material, said fourth material comprising oxygen and one of lanthanum or lutetium.

* * * * *